(12) United States Patent
Steenwyk

(10) Patent No.: US 7,023,215 B2
(45) Date of Patent: Apr. 4, 2006

(54) FIELD EFFECT SENSOR TWO WIRE INTERCONNECT METHOD AND APPARATUS

(75) Inventor: Timothy Edward Steenwyk, Grandville, MI (US)

(73) Assignee: TouchSensor Technologies LLC, Wheaton, IL (US)

( * ) Notice: Subject to any disclaimer, the term of this patent is extended or adjusted under 35 U.S.C. 154(b) by 0 days.

(21) Appl. No.: 10/828,004

(22) Filed: Apr. 20, 2004

(65) Prior Publication Data

US 2005/0068049 A1    Mar. 31, 2005

Related U.S. Application Data

(60) Provisional application No. 60/464,613, filed on Apr. 22, 2003.

(51) Int. Cl.
G01R 31/327    (2006.01)
G01R 31/26     (2006.01)

(52) U.S. Cl. ........................ 324/415; 324/769

(58) Field of Classification Search ............... 324/769, 324/713, 457, 415; 341/33; 307/116; 345/173, 345/174

See application file for complete search history.

(56) References Cited

U.S. PATENT DOCUMENTS

| | | | |
|---|---|---|---|
| 3,493,791 A * | 2/1970 | Adelson | 327/450 |
| 3,668,698 A * | 6/1972 | Demirdjioghlou et al. | 341/33 |
| 3,740,744 A | 6/1973 | Nakada et al. | 341/33 |
| 4,063,111 A * | 12/1977 | Dobler et al. | 307/116 |
| 5,648,722 A * | 7/1997 | Merry et al. | 324/417 |
| 2002/0057020 A1* | 5/2002 | Caldwell | 307/112 |
| 2004/0263201 A1* | 12/2004 | Kiep | 324/769 |
| 2005/0168909 A1* | 8/2005 | Hoekstra | 361/271 |

* cited by examiner

*Primary Examiner*—Anjan Deb
(74) *Attorney, Agent, or Firm*—Jenner & Block LLP

(57) ABSTRACT

A field effect sensor interfaces with a power supply and detection circuit using two wires. The detection circuit can determine which of several parallel-connected field affect sensors is or is not activated at any given time.

14 Claims, 3 Drawing Sheets

FIELD EFFECT SENSOR TWO WIRE INTERCONNECT METHOD AND APPARATUS

CROSS REFERENCE TO RELATED APPLICATIONS

This application claims priority from U.S. Provisional Patent Application 60/464,613, filed on Apr. 22, 2003, the disclosure of which is incorporated herein by reference.

BACKGROUND OF THE INVENTION

1. The Technical Field

The present invention is directed to methods and apparatus for interconnecting a field effect sensor with a control system or controlled device using only two wires.

2. The Prior Art

Mechanical switches are sometimes used to detect change in position of a mechanical part or level of a fluid, among other things. Such uses are particularly prevalent in automotive applications. For example, mechanical switches have long been used in automobiles to sense parameters such as throttle position and windshield washer fluid level.

Although mechanical switches have been refined extensively over the years, they nevertheless are inherently prone to failure because they include moving parts. Further, such switches are often used in connection with mechanical linkages which also are inherently prone to failure and which add cost, weight, and complexity.

Field effect sensors have been used as replacements for mechanical switches in many applications. Indeed, field effect sensors can be used to sense proximity of a mechanical part or a liquid. Field effect sensors have many advantages over mechanical switches. For example, they have no moving parts which can wear out or break. Also, they can be inexpensively mass-produced and customized for use in applications that would not readily accommodate mechanical switches.

Mechanical switches in their simplest form are two-wire (input and output) devices that mechanically make or break an electrical circuit. They operate using mechanical force and do not require electrical power for their operation. Conversely, field effect sensors are solid state-devices which require electrical power for their operation. Accordingly, a field effect sensor typically requires at least one more wire for its operation than does a mechanical switch. As such, known field effect sensors typically cannot be used as drop-in replacements for mechanical switches without some modification to the apparatus into which they would be installed.

DETAILED DESCRIPTION OF THE ILLUSTRATED EMBODIMENT

Figure 1:
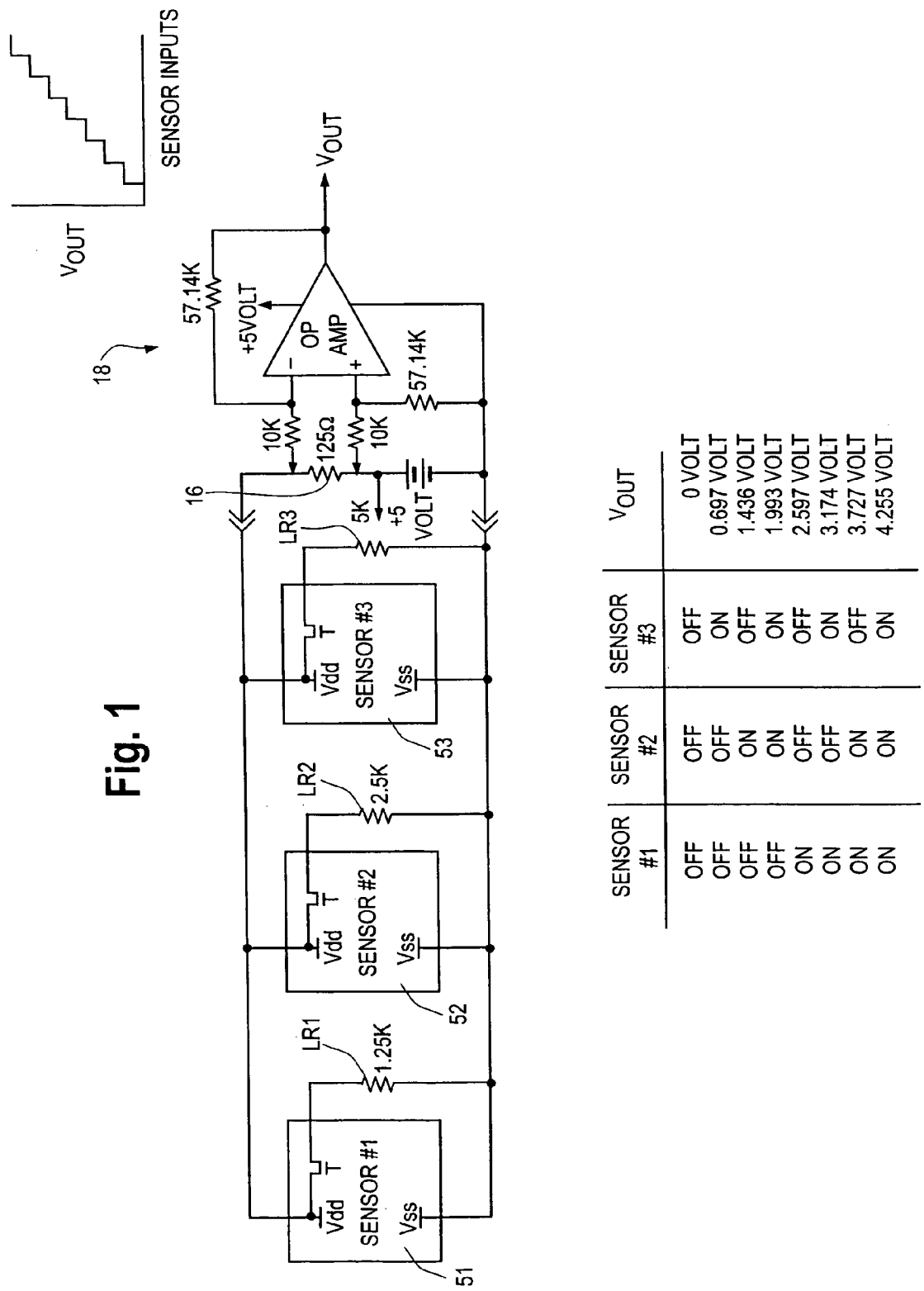
FIG. 1 illustrates schematically a first embodiment of the present invention.

FIG. 1 illustrates a first preferred embodiment of the present invention wherein first, second and third field effect sensors S1, S2, S3 are connected to power supply 10 over two wires 12,14 in a daisy chain configuration. Sensors S1, S2, S3 preferably are embodied as field effect sensors using a TS100 integrated control circuit available from TouchSensor Technologies, LLC of Wheaton, Ill. A corresponding load resistor LR1, LR2, LR3 is connected to the output of each sensor S1, S2, S3, respectively. Each load resistor LR1, LR2, LR3 has a unique value of resistance. Other embodiments can use more or fewer than three sensors and corresponding load resistors. Detection circuit 18 detects the current drawn by sensors S1, S2, S3. In the illustrated embodiment, detection circuit 18 includes sense resistor 16 between power supply 10 and sensors S1, S2, S3. Detection circuit 18 detects the voltage drop across sense resistor 16 and provides an output line $V_{out}$ to a suitable decoding circuit, for example, an analog to digital converter, as would be known to one skilled in the art. The design of detection circuit 18 is not critical to the invention. The design shown in FIG. 1 is for illustration and can be varied or substituted with another design as would be known to one skilled in the art.

When none of sensors S1, S2, S3 is activated, sensors S1, S2, S3 draw a baseline current from power supply 10. This baseline current can be detected as a voltage drop across sense resistor 16 or in any other suitable manner, as would be known to one skilled in the art. Typically, this baseline current will be negligible and, accordingly, will produce a negligible voltage drop across sense resistor 16.

When any of sensors S1, S2, S3 is activated through touch or proximity of an object or fluid, additional current is drawn from power supply 10 in response to the sensor activation. This additional current is a function of the value of the load resistor connected to the activated sensor's output. Because each load resistor has a unique value of resistance, this additional current varies depending on which of sensors S1, S2, S3 is activated. This additional current can be detected as an additional voltage drop across sense resistor 16 or in any other suitable manner, as would be known to one skilled in the art.

By monitoring the baseline current (or corresponding voltage drop across sense resistor 16) and changes thereto, it can be readily determined which, if any, of sensors S1, S2, S3 is activated at any particular time. Indeed, load resistances LR1, LR2, LR3 can be selected such that a unique additional current is drawn for each unique combination of sensors S1, S2, S3 activated simultaneously. Thus, it can be readily determined which combination, if any, of sensors S1, S2, S3 is activated at any particular time.

For example, FIG. 1 illustrates an embodiment having a nominal 5 volt power supply 10, a 125 ohm sense resistor 16 and 1.25 K-ohm, 2.5 K-ohm, and 5 K-ohm load resistances L1, L2, L3, respectively. These specific values are provided here for illustration and can vary to meet the demands of any particular application, as would be known to one skilled in the art. As discussed above, negligible current is required to power sensors S1, S2, S3 when none of them is actuated. Thus, when none of sensors S1, S2, S3 is activated, the voltage drop across sense resistor 16 is negligible and the output $V_{out}$ of detection circuit 18 is 0 volts. If sensor S3 is activated and sensors S1 and S2 are not activated, the current through sense resistor 16 is substantially equal to the current through load resistor LR3, producing a corresponding voltage drop across sense resistor 16. Based on this voltage drop, detection circuit 18 outputs a signal $V_{out}$ of 0.714 volts. Based on this output voltage, the decoding circuit (not shown) determines that sensor S3, but not sensors S1 and S2, must have been activated. Similarly, if sensors S1 and S2 are activated and sensor S3 is not activated, the current through sense resistor is substantially equal to the sum of the currents through load resistors LR1 and LR2, producing a corresponding voltage drop across sense resistor 16. Based on this voltage drop, detection circuit 18 outputs a signal $V_{out}$ of 4.28 volts. Based on this output voltage, the decoding circuit (not shown) determines that sensors S1 and S2, but not sensor S3, must have been activated. The table in FIG. 1 illustrates that a unique output $V_{out}$ is produced for each unique combination of sensors activated at any given time. Based on the value of $V_{out}$ at any particular time, the decoding circuit determines which individual sensor or combination of sensors is activated at that time.

Figure 2A:
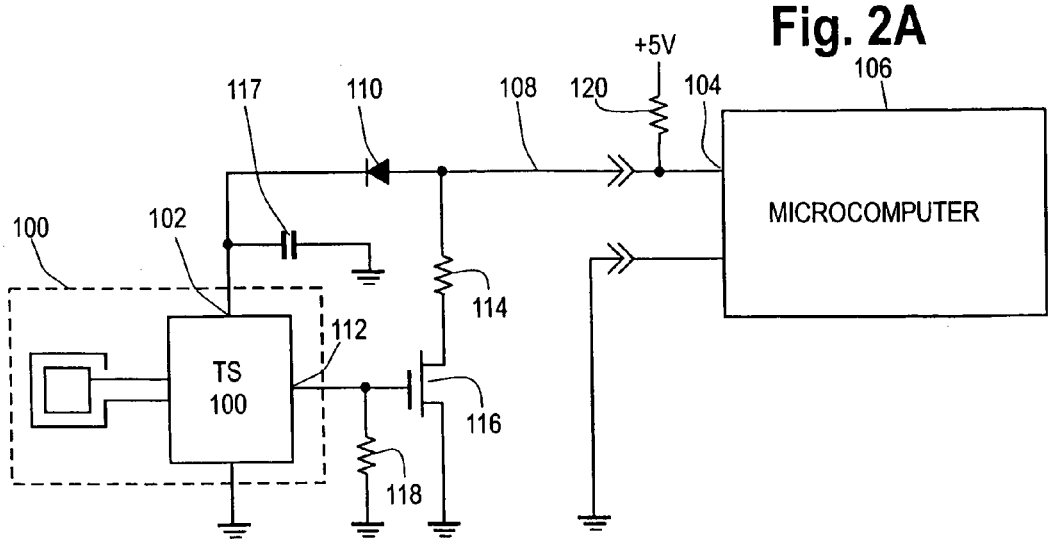
FIG. 2A illustrates schematically a second embodiment of the present invention.
Figure 2B:
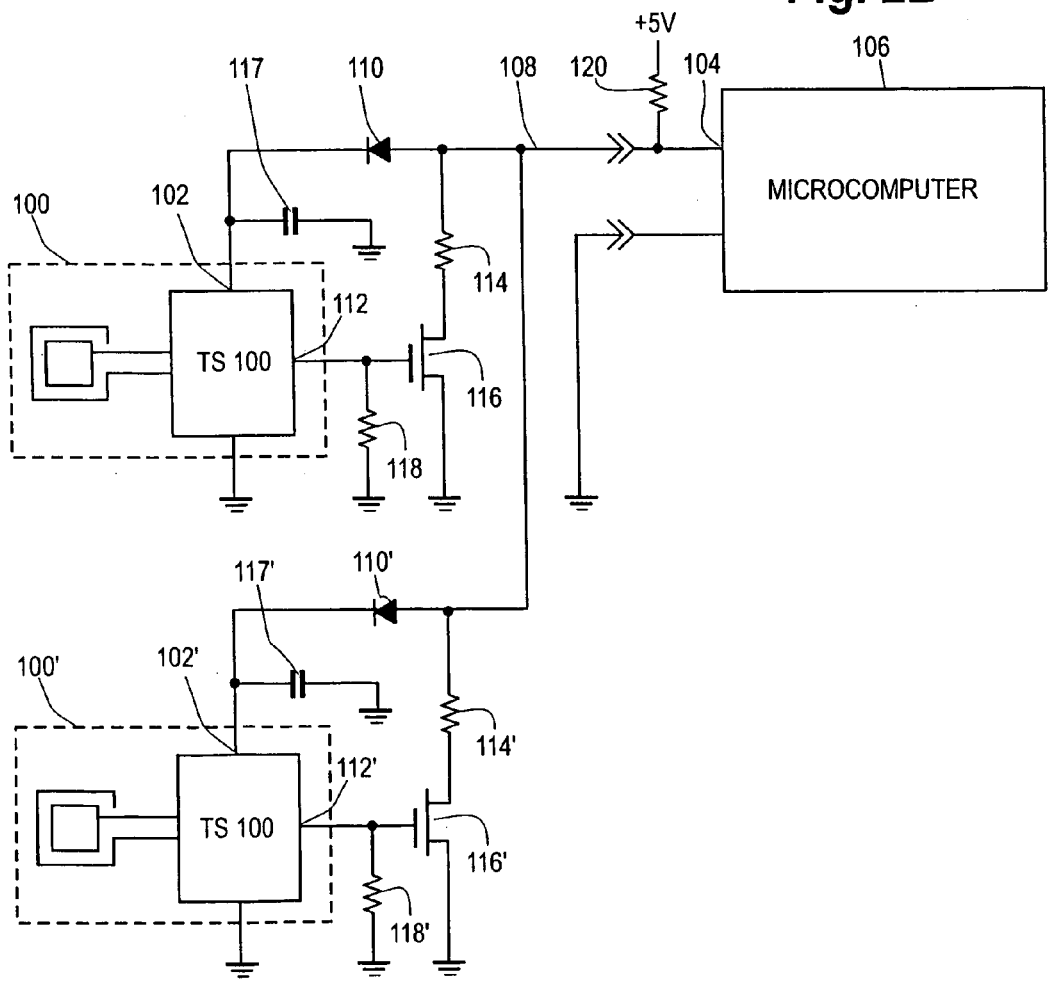
FIG. 2B illustrates schematically an alternate form of a second embodiment of the present invention.

FIGS. 2A and 2B illustrate a second embodiment of the present invention wherein a capacitor is used as a temporary local power supply for a field effect sensor. Referring to FIG. 2A, power input 102 of field effect sensor 100 is coupled through isolation diode 110 to a pulse generator and detection circuit via line 108. In a preferred embodiment, the pulse generator and detection circuit is embodied as microcomputer 106 having a reconfigurable port 104 to which line 108 is connected. Output 112 of field effect sensor 100 is coupled to port 104 through switched resistor 114 and FET 116. Port 104 selectively functions as an input port and output port, as discussed below. Capacitor 117 is coupled between ground and the node coupling diode 110 and power input 102 of sensor 100. Pull-down resistor 118 is coupled between ground and the node coupling sensor 100 output 112 and the gate of FET 116. A first terminal of pull-up resistor 120 is connected to a source of electrical potential, in this example, a 5 V source. The second terminal of pull-up resistor 120 is connected to line 108. Pull-up resistor 120 is shown as a discrete component separate from microcomputer 106. Alternatively, pull-up resistor 120 could be integral with, or its function otherwise could be provided by, microcomputer 106, as would be known to one skilled in the art.

With port 104 configured as an output port, microcomputer 106 outputs a pulse through port 104 over line 108 and through isolation diode 110. This pulse powers sensor 100 and charges capacitor 117. In the subsequent no-pulse condition, the energy stored in capacitor 117 continues to power sensor 100 for a short period of time. During this time, with port 104 reconfigured as an input port, microcomputer 106 can read data from line 108.

When sensor 100 is not activated, output 112 of sensor 100 is low and FET 116 is in the "off" state. In this state, no current flows through FET 116. Thus, the potential at line 108 is at 5 V. Microcomputer 106 senses this voltage through port 104 (while port 104 is configured as an input port) and determines, based on the sensed voltage, that sensor 100 is in the not activated condition.

When sensor 100 is activated, output 112 of sensor 100 is high, switching FET 116 to the "on" state. In this state, current flows from the 5 V source, through FET 116, to ground. Pull-up resistor 120 and switched resistor 114 function as a voltage divider, wherein the voltage at the node between these two resistors is between 0V and 5V. Microcomputer 106 senses this voltage through port 104 (while port 104 is configured as an input port) and determines, based on the sensed voltage, that sensor 100 is in the activated condition.

Referring to FIG. 2B, the principles of this embodiment of the present invention can be applied to operate and read multiple sensors 100 using a single pulse generator and detection circuit. FIG. 2B differs from FIG. 2A in that FIG. 2B illustrates a second sensor 100' and corresponding circuitry (namely, sensor input 102', sensor output 112', capacitor 117', diode 110', FET 116', switched resistor 114', and pull-down resistor 118') coupled to microprocessor 106 through line 108 and port 104. The circuitry corresponding to sensor 100' is generally the same as the circuitry corresponding to sensor 100, except that switched resistors 114 and 114' have different values of resistance. Thus, when sensor 100 is activated and sensor 110' is not activated, a first voltage is present at the node between pull-up resistor 120 and switched resistors 114 and 114'. Based on the value of this first voltage, microprocessor 106 determines that sensor 100 is in the activated condition and sensor 100' is in the not activated condition. Likewise, when sensor 100' is activated and sensor 110 is not activated, a second voltage is present at the node between pull-up resistor 120 and switched resistors 114 and 114'. Based on the value of this second voltage, microprocessor 106 determines that sensor 100' is in the activated condition and sensor 100 is in the not activated condition. Similarly, when both sensors 100 and 100' are activated, a third voltage is present at the node between pull-up resistor 120 and switched resistors 114 and 114'. Based on the value of this third voltage, microprocessor 106 determines that both sensors 100 and 100' are in the activated condition. Additional sensors and corresponding circuitry can be coupled to line 108 and operated and read in this manner, as would be known to one skilled in the art.

Figure 3:
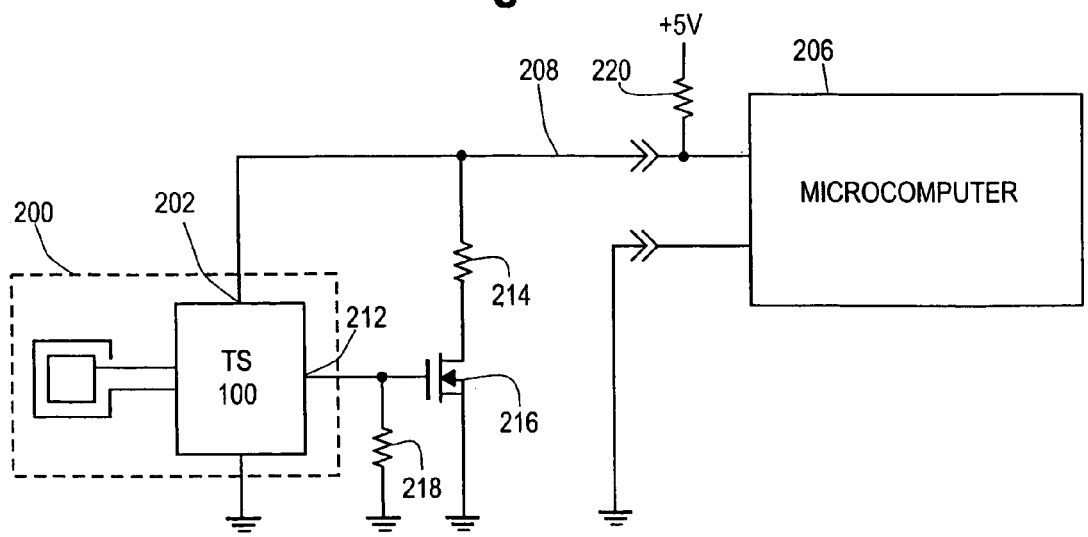
FIG. 3 illustrates schematically a third embodiment of the present invention.

FIG. 3 illustrates a third embodiment of the present invention wherein power input 202 of sensor 200 is coupled to a pulse generator and detection circuit, for example, microcomputer 206, via line 208 and output 212 of sensor 200 is coupled to line 208 via FET 216 and load resistor 214. Pull-down resistor 218 is coupled between ground and the node coupling sensor 200 output 212 and the gate of FET 216. A first terminal of pull-up resistor 220 is connected to a voltage source, for example, a 5 V source, and the second terminal of pull-up resistor 220 is connected to line 208. Load resistor 214 and pull-up resistor 220 each preferably have a value of about 100 ohms. As in FIGS. 2A and 2B, pull-up resistor 220 is shown as a discrete component separate from microcomputer 206. Alternatively, pull-up resistor 220 could be integral with, or its function otherwise could be provided by, microcomputer 206, as would be known to one skilled in the art.

When sensor 200 is not activated, its output 212 is low. Thus, FET 216 is in the "off" state. In this condition, the full voltage provided from microcomputer 206 is applied to sensor 200. When sensor 200 is activated, output 212 is high, switching transistor 216 to the "on" state. In this condition, pull-up resistor 220 and load resistor 214 form a voltage divider, and the voltage applied to sensor 200 is substantially equal to the voltage drop across load resistor 214. Microcomputer 206 senses the voltage applied to sensor 200 and thus determines whether sensor 200 is activated or not.

In alternate embodiments, pull-up resistor 220 can be omitted and/or current sensing techniques can be used to detect whether sensor 200 is activated or not. As discussed above, when sensor 200 is not activated, FET 216 is in the "off" state and the only current through line 208 is the negligible current required to power sensor 200. Microcomputer 206 perceives this condition as an open circuit, as it would a mechanical switch with open contacts. When sensor 200 is activated, transistor 216 is in the "on" state, enabling current through load resistor 214. Microcomputer 206 detects the increased current and determines that sensor 200 is activated. Indeed, if load resistor is selected to have a sufficiently low value of resistance, for example, 100 ohms, microcomputer 206 perceives the current through load resistor 214 as a dead short, as it would a mechanical switch with closed contacts.

Figure 4:
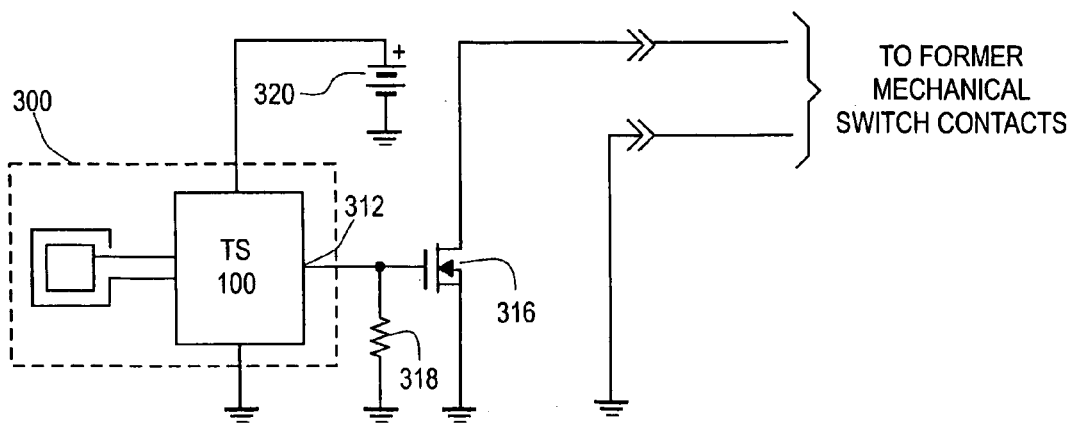
FIG. 4 illustrates schematically a fourth embodiment of the present invention.

FIG. 4 illustrates a fourth embodiment of the present invention wherein a battery 320 provides power to sensor 300. Output 312 of sensor 300 is coupled to the gate of FET 316 and to pull-down resistor 318. When sensor 300 is not activated, output 312 is low, and FET 316 is in the "off" state, emulating a mechanical switch with open contacts. When sensor 300 is activated, output 312 is high, switching FET 316 to the "on" state, emulating a mechanical switch with closed contacts. Sensor 300 with battery 320 can be used as a drop in replacement for a mechanical switch because it does not require any wiring beyond that provided for the mechanical switch. The sensor input and output can simply be connected to the same wires to which the former mechanical switch was connected.

While several embodiments of the present invention have been shown and described above, it will be obvious to those skilled in the art that numerous modifications can be made without departing from the spirit of the invention, the scope of which is defined by the claims below.

I claim:

1. An apparatus for powering and reading data from a plurality of field effect sensors over two wires, comprising:
    a power supply;
    a first field effect sensor having a first power terminal coupled to a first terminal of said power supply and a second power terminal coupled to a second terminal of said power supply;
    a first load resistor having a first terminal coupled to an output terminal of said first field effect sensor and a second terminal coupled to said second terminal of said power supply, said first load resistor having a first value of resistance;
    a second field effect sensor having a first power terminal coupled to a first terminal of said power supply and a second power terminal coupled to a second terminal of said power supply;
    a second load resistor having a first terminal coupled to an output terminal of said second field effect sensor and a second terminal coupled to said second terminal of said power supply, said second load resistor having a second value of resistance, said second value of resistance being substantially different from said first value of resistance; and
    a detection circuit coupled to said first field effect sensor and said second field effect sensor.

2. The apparatus of claim 1 further comprising:
    a third field effect sensor having a first power terminal coupled to a first terminal of said power supply and a second power terminal coupled to a second terminal of said power supply; and
    a third load resistor having a first terminal coupled to an output terminal of said third field effect sensor and a second terminal coupled to said second terminal of said power supply, said third load resistor having a third value of resistance, said third value of resistance being substantially different from said first value of resistance and said second value of resistance,
    said detection circuit further coupled to said third field effect sensor.

3. The apparatus of claim 2 wherein said first, second, and third values of resistance are selected such that none of said three values of resistance is substantially equal to the mathematical sum of said other two values of resistance.

4. The apparatus of claim 1 further comprising a sense resistor coupled to said first power terminal of said first field effect sensor and said first power terminal of said second field effect sensor.

5. The apparatus of claim 4 wherein said sense resistor is coupled between first and second input terminals of said detection circuit.

6. The apparatus of claim 1 further comprising a decoding circuit coupled to said detection circuit, said decoding circuit configured to determine the state of said first field effect sensor and said second field effect based on the output of said detection circuit.

7. An apparatus for powering and reading data from a field effect sensor over two wires, comprising:
    a pulse generator and detection circuit having an input/output terminal;
    a field effect sensor having a first power terminal and an output terminal;
    said first power terminal of said field effect sensor coupled to said input/output terminal;
    a transistor having a power terminal coupled to said input/output terminal;
    a load resistor coupled between said power terminal of said transistor and said input/output terminal;
    a pull-up resistor coupled between a source of power and said input/output terminal; and
    said output terminal of said field effect sensor coupled to the control terminal of said transistor.

8. An apparatus for switching a controlled device over two wires, comprising:
    a field effect sensor having a first power terminal and an output terminal;
    a battery coupled to said first power terminal of said field effect sensor, said battery providing power to said field effect sensor and said battery not providing power to said controlled device; and
    means, coupled to said two wires and to said output terminal of said field effect sensor, for switching said controlled device.

9. The apparatus of claim 8 wherein said means for switching comprises a transistor.

10. An apparatus for powering and reading data from a field effect sensor over two wires, comprising:
    a first field effect sensor having a power terminal and an output terminal;
    a first storage capacitor coupled to said power terminal of said first field effect sensor;
    a pulse generator and detection circuit having an input/output terminal, said input/output terminal coupled to said power terminal of said first field effect sensor and to said output terminal of said first field effect sensor, said control circuit adapted to selectively output a power signal to said power terminal of said first field effect sensor and said first storage capacitor and to selectively receive a data signal corresponding to the state of said output terminal of said first field effect sensor;
    a first diode coupled between (a) said power terminal of said first field effect sensor and said first storage capacitor and (b) said input/output terminal; and
    a first transistor coupled between said output terminal of said first field effect sensor and said input/output terminal, said output terminal of said first field effect sensor coupled to the control terminal of said first transistor.

11. The apparatus of claim 10 further comprising a first resistor and a second resistor coupled in series as a voltage divider, said input/output terminal coupled to the junction of said first resistor and said second resistor.

12. The apparatus of claim 10 further comprising:
a second field effect sensor having a power terminal and an output terminal;
a second storage capacitor coupled to said power terminal of said second field effect sensor;
a second diode coupled between (a) said power terminal of said second field effect sensor and said first storage capacitor, and (b) said input/output terminal; and
a second transistor coupled between said output terminal of said second field effect sensor and said input/output terminal, said output terminal of said second field effect sensor coupled to the control terminal of said second transistor.

13. A method for powering and reading data from a field effect sensor having a power terminal coupled to an input/output terminal of a pulse generator and detection circuit and an output terminal coupled to the control terminal of a transistor, said transistor further coupled to said input/output terminal of said pulse generator and detection circuit, comprising the steps of:
outputting a power signal from said input/output terminal of said pulse generator and detection circuit;
providing said power signal to a storage capacitor coupled to said power terminal of said field effect sensor;
powering said field effect sensor by discharging said capacitor through said power terminal of said field effect sensor;
detecting through said input/output terminal the voltage present at said input/output terminal;
determining the state of said field effect sensor based on said voltage at said input/output terminal.

14. A method for powering and reading data from a field effect sensor having a power terminal coupled to an input/output terminal of a pulse generator and detection circuit and an output terminal coupled to the control terminal of a transistor, said transistor further coupled to said input/output terminal of said pulse generator and detection circuit, comprising the steps of:
outputting a power signal from said input/output terminal of said pulse generator and detection circuit;
providing said power signal to said power terminal of said field effect sensor;
detecting through said input/output terminal the voltage present at said input/output terminal; and
determining the state of said field effect sensor based on said voltage at said input/output terminal.

* * * * *